(12) United States Patent
Chan

(10) Patent No.: US 6,757,969 B1
(45) Date of Patent: Jul. 6, 2004

(54) METHOD OF MANUFACTURING A LIGHT EMITTING DIODE UNIT BODY

(76) Inventor: Tsung-Wen Chan, No. 19, Lane 292, Sec. 1, Datung Rd., Shijr City, Taipei County (TW)

( * ) Notice: Subject to any disclaimer, the term of this patent is extended or adjusted under 35 U.S.C. 154(b) by 91 days.

(21) Appl. No.: 10/018,086

(22) PCT Filed: Aug. 18, 2000

(86) PCT No.: PCT/CN00/00240

§ 371 (c)(1),
(2), (4) Date: Dec. 14, 2001

(87) PCT Pub. No.: WO01/20688

PCT Pub. Date: Mar. 22, 2001

(30) Foreign Application Priority Data

Sep. 14, 1999 (JP) .......................................... 11/260251

(51) Int. Cl.[7] .................................................. H05K 3/30
(52) U.S. Cl. .............................. 29/841; 29/843; 29/855; 29/876; 29/883; 29/884; 257/100; 264/272.15
(58) Field of Search .......................... 29/832, 837, 841, 29/843, 848, 854–856, 876, 877, 883, 884, 885; 257/E25.028, 79, 88, 91, 99, 100; 264/272.11, 272.25, 272.16; 313/312; 362/363, 800, 812; 228/180.21, 248.1, 254

(56) References Cited

U.S. PATENT DOCUMENTS

| 5,036,248 A | * | 7/1991 | McEwan et al. ............ 362/800 |
| 5,278,235 A | * | 1/1994 | Tajima et al. ................ 525/154 |
| 5,313,729 A | * | 5/1994 | Sakai et al. .................. 362/227 |
| 5,382,811 A | * | 1/1995 | Takahashi .................... 257/100 |
| 5,808,592 A | * | 9/1998 | Mizutani et al. ............ 313/512 |

FOREIGN PATENT DOCUMENTS

JP    08-202290    *  9/1996    ............. G09F/9/33

* cited by examiner

Primary Examiner—Peter Vo
Assistant Examiner—Donghai D. Nguyen
(74) Attorney, Agent, or Firm—Rosenberg, Klein & Lee

(57) ABSTRACT

Method of fabricating LED assembly disclosed herein can provides a string of original colored high intensity LEDS usable for screen displaying or traffic signal lights molded by injecting harmless polyacrylic resin in a short time duration and at low temperature.

3 Claims, 7 Drawing Sheets

METHOD OF MANUFACTURING A LIGHT EMITTING DIODE UNIT BODY

BACKGROUND OF THE INVENTION

1. Field of the Invention

The present invention relates to method of fabricating LED assembly, and more particularly, to method of fabricating a string of original colored (E,G,B) high intensity LEDS (Light Emitting Diodes) to be displayed on a screen or used as a traffic light source.

2. Description of the Prior Art

In conventional method of fabricating LED assembly, an epoxy resin added with a hardener molded by baking at high temperature (90° C.~110° C.) is a commonly adopted procedure. For example, in a cited case herein, which was patented by NO3 11269 in Taiwan, a fabrication method by plastic packaging was employed. The material used for fabrication was a plastic resin (an hardener was required to cure its softness at room temperature) applied to the micro structure of a semiconductor surface by coating or spraying, them the later fabricating steps were successively carried out after hardening of the plastic resin. As the package was performed by coating or spraying, the finished surface of the product was somewhat uneven. In addition, such a fabrication method provided by the cited case is only applicable for semiconductor packaging owing to the fact that it is unable to withstand ejecting pressure higher than 40 psi.

Since high intensity blue colored LED has come to practical use, it soon becomes a favorite of multi-media world. Further innovation on precision of light emission angle and uniformity in tint are asked that can not be attained with a conventional resin treatment.

Filling epoxy resin or silicone rubber in a LED assembly housing by heating at a temperature above 120° C. in an oven, the rate of yield scarcely exceeds 90% with disqualified results in disorganized disposal of elements, inadequate quantity of resin attachment, and unevenness of surface. Besides, a cracked resin package is not repairable and inadvertent spattering of resin in the front of surface an unit LED causes degrading of brightness.

High intensity blue or green LED lighting source should be reliably made watertight if it is to be installed outdoor. However, such an aim is hard to be attained by a conventional method of driving in an oven after instilling a resin with a low cost.

In order to overcome the shortcomings inherent to the conventional technique described above, the present inventor has delved into this matter with a long time efforts and came to realization of the present invention.

SUMMARY OF THE INVENTION

It is an object of the present invention to provide method of fabricating LED assembly by using polyacrylic resin as a essential packaging material and applying a pressure above 40 psi to integrally form a watertight contour of a string of LED assembly by injection molding process so as to obtain a good looking, smooth surfaced appearance of the product.

It is another object of the present invention to provide method of fabricating LED assembly by using an innovative plastic resin injection machine to save 50% time needed in the whole stages of fabrication so as to minimize production cost internationally competitive with other leading countries in this field of technology.

In the method of the present invention, the time duration required for polyacrylic resin injection per round is only about 40 sec with temperature descending from 110° C. down to below 60° C. fully in compliance with internationally standardized LED fabrication specification and increase of 130 times production speed compared with general conventional method of fabrication. Besides, in case the housing of the LED assembly is cracked, it is 99% repairable by fusing plastic resin of the housing.

To enable a further understanding of the innovative and technological content of the invention herein, refer to the detailed description of the invention and the accompanying brief description of the drawings appended below. Furthermore, the attached drawings are provided for purposes of reference and explanation, and shall not be construed as limitations applicable to the invention herein.

BRIEF DESCRIPTION OF THE DRAWINGS

The drawings disclosed two illustrative embodiments of the present invention which serve to exemplify the various advantages and objects hereof, and as follows.

DETAILED DESCRIPTION OF THE PREFERRED EMBODIMENT

Figure 1:
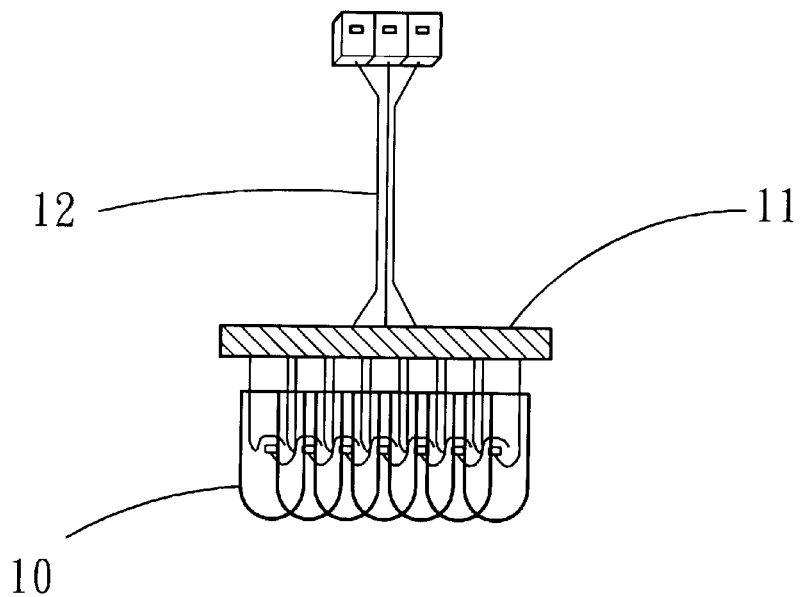
FIG. 1 is a view illustrating the first step of method of fabricating LED assembly according to the present invention.

In the method of fabricating LED assembly of the present invention shown in FIG. 1 at first step, a plurality of unit LEDS 10 welded onto an electrical board 11 which has been already cut into a desired shape, then lead conductors 12 are welded to the electrical board 11 at a proper position. The unit LEDS are disposed according to a definite way so as to exhibit a lustrous and beautiful high quality mixed color later on.

Figure 2:
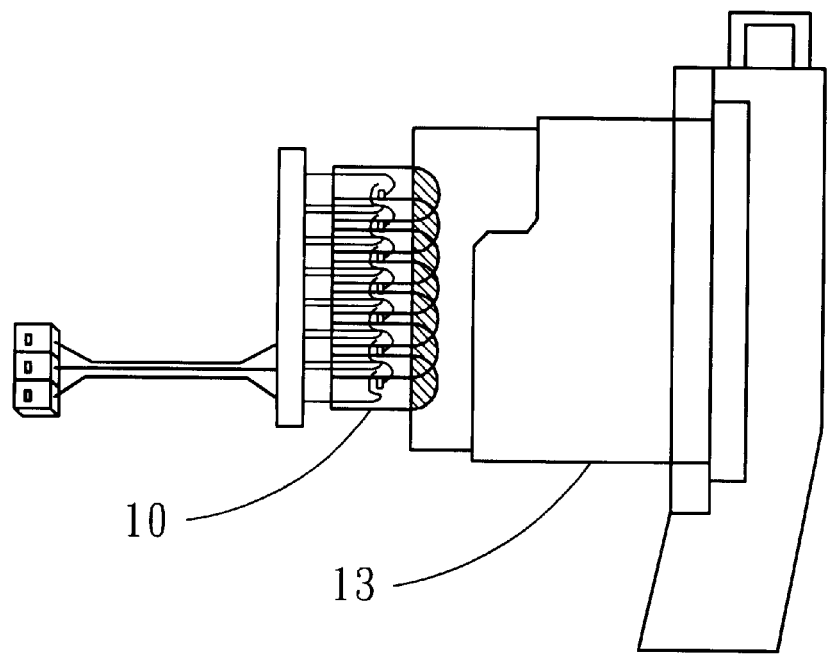
FIG. 2 is a view illustrating the second step of method of fabricating LED assembly according to the present invention.

In the second step shown in FIG. 2, the string of LEDS 10 buried in a framed gutter 13 and fixed therein, the gutter 13 shall be well fitted for the unit LEDS 10 in every respect such that the resin to be injected thereinto in the next step will not overflow thereby ensuring a good product quality.

Figure 3:
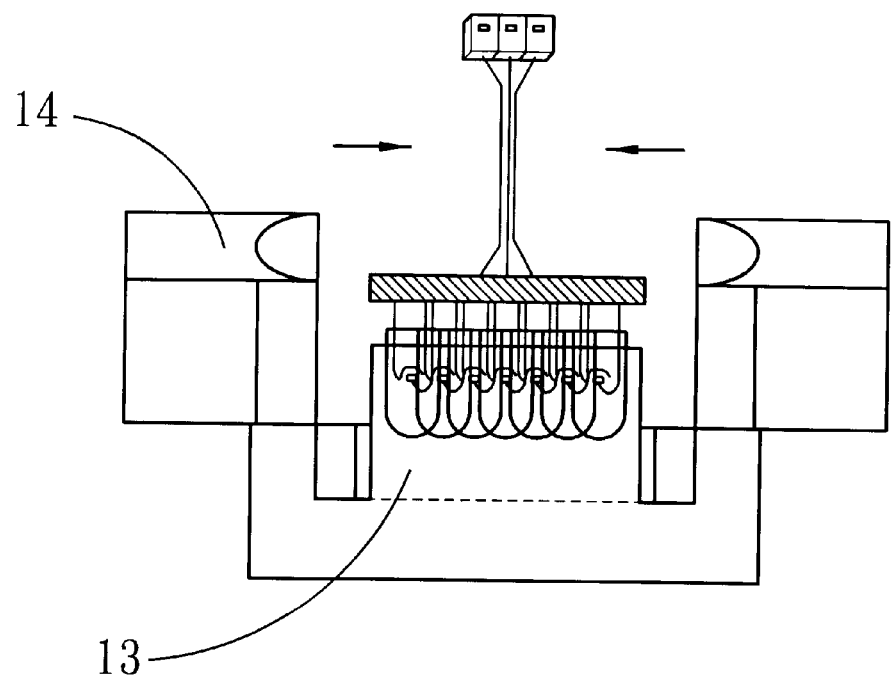
FIG. 3 is a view illustrating the third step of method of fabricating LED assembly according to the present invention.

In the third step shown in FIG. 3, the framed gutter 13 together with the LED assembly 10 is put in a mold cavity of a mold 14 which is to be closed both from right and left, and the LED assembly 10 is settled thereat.

Figure 4:
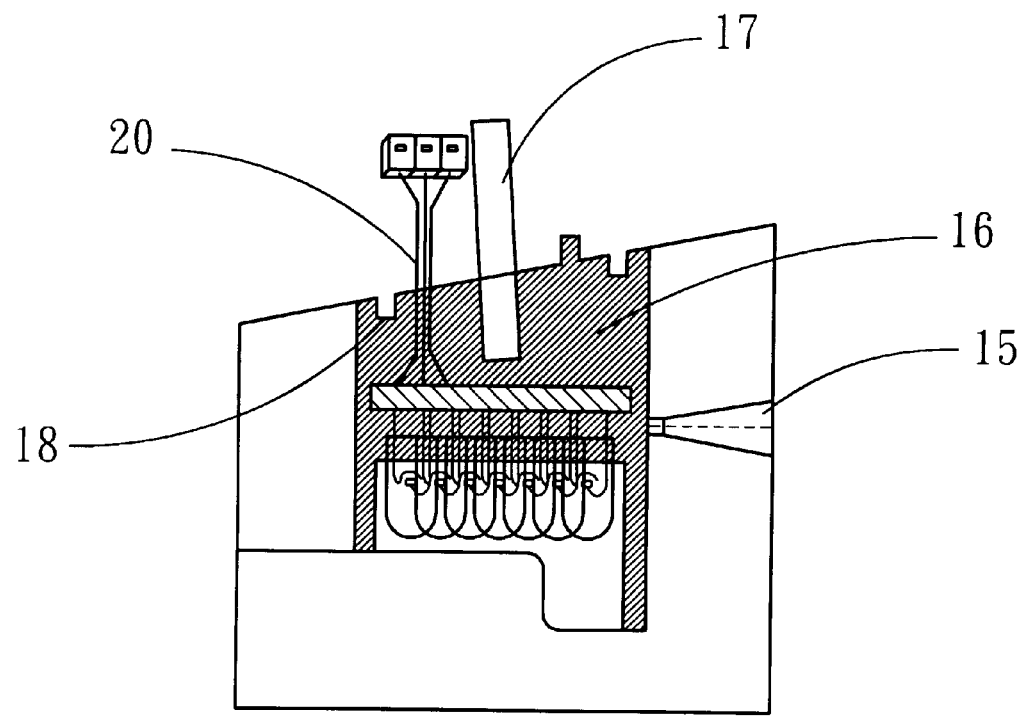
FIG. 4 is a view illustrating the fourth step of method of fabricating LED assembly according to the present invention.

In the fourth step shown in FIG. 4 polyacrylic resin 16 is injected into the framed gutter 13 from an injection port 15, and a copper stick 17 is simultaneously inserted thereinto to stabilized the injection operation. It should be noted that an annular groove 18 will be formed at the rear part of the injected polyacrylic resin 16. However, a rubber ring 19 (not shown) can be filled therein for preventing entry of water drips in a rainy day so as to protect the product from defection.

Figure 5:
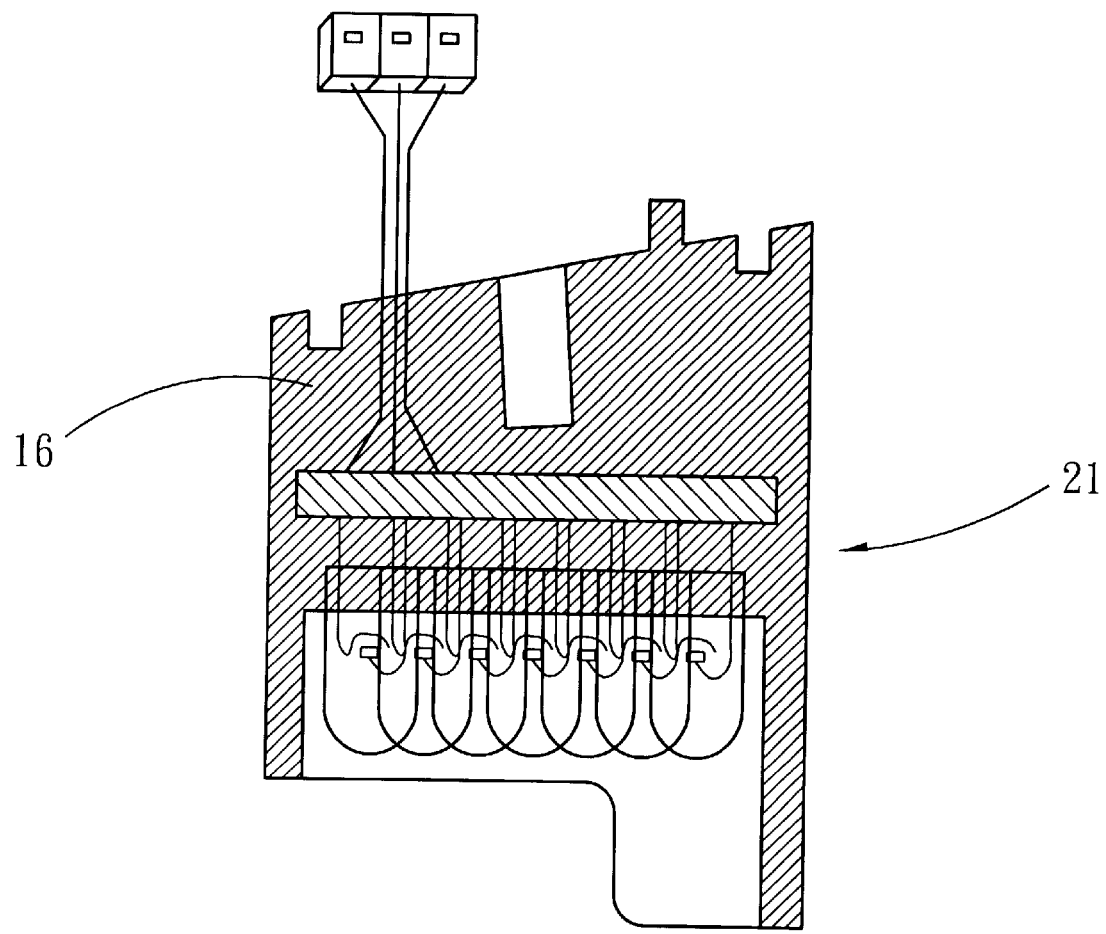
FIG. 5 is a view illustrating the fifth step of method of fabricating LED assembly according to the present invention.

In the fifth step shown in FIG. 5, a finished product of LED assembly 21 is taken out from the mold 14 thus completing the whole fabrication steps. In the present invention, the time required for polyacrylic resin 16 injection per round is only about 30 sec. with temperature descending from 90° C. down to below 60° C. fully in compliance with internationally standardized LED fabrication specification, and the rate of yield attains as high as 99%.

For comparison, in a conventional fabrication method using epoxy resin or silicone rubber as a packaging material, and heating in an oven at a temperature above 120°, the rate of yield obtainable is below 90% accompanying with dissatisfactory structure of resin package, and unsmoothness of the finished product.

Figure 6:
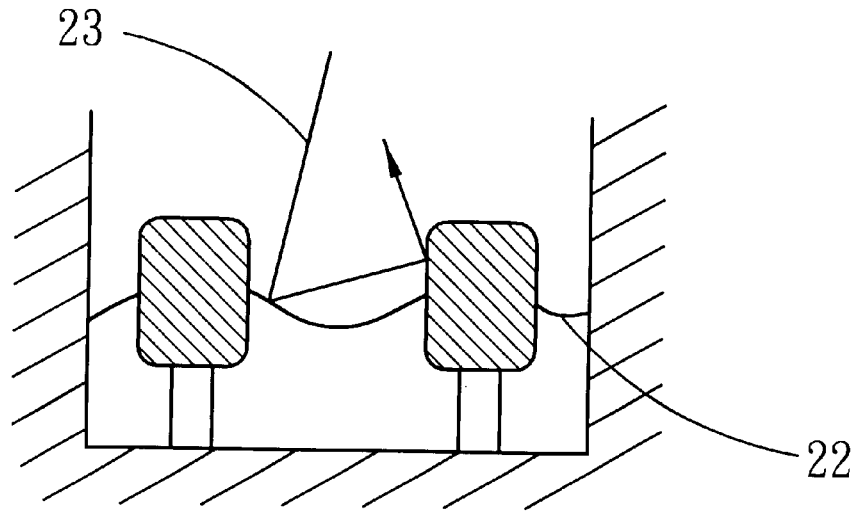
FIG. 6A is a fragmentary cross sectional view of a conventional LED assembly.
FIG. 6B is another fragmentary cross sectional view of a conventional LED assembly.
Figure 6:
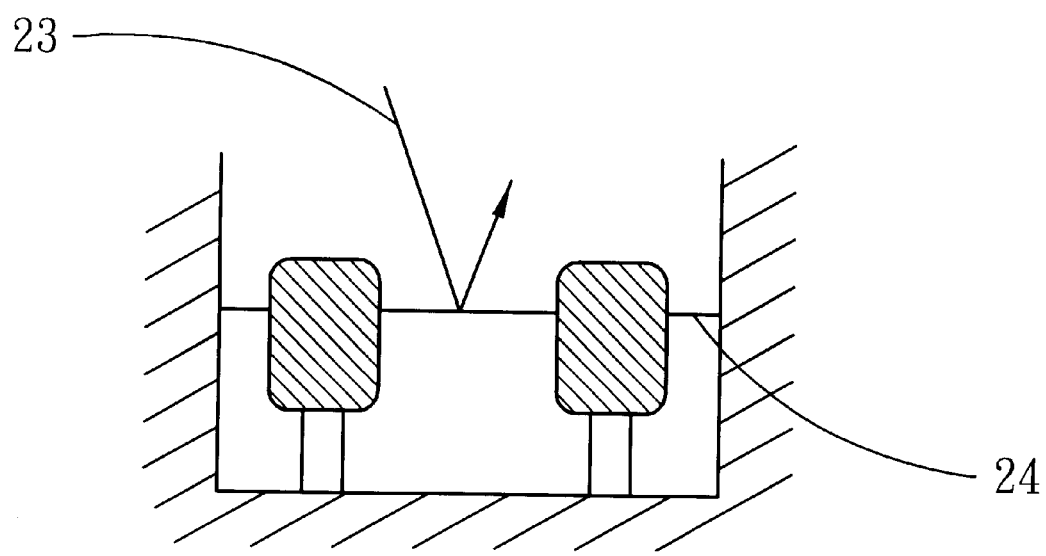

For a further comparison between the product fabricated according to a convention method and that according to the present invention, reference should be made to FIGS. 6A and 6B. As shown in FIG. 6A, the product molded with epoxy resin or silicone rubber is finished in such a state that the surface between adjacent unit LEDS is formed in an arcuate FIG. 22, an incident light 23 (from a lamp source or sun light) is reflected in diffusing state lacking uniformity in brightness and homogeneity in color. On the contrary, the fabrication method according to the present invention is employed in FIG. 6B wherein the product is molded with polyacrylic resin by injection process lasting for approximately 30 sec at a temperature descending from 90° C. to below 60° C. It should be noted that the product fabricated in a withstandable temperature and time duration has a resultant planar surface 24 between adjacent unit LEDS which acts as a reflecting mirror against an incident light (from a lamp source or sun light) so that there are no shortcomings as that of the product fabricated according to the conventional techniques.

Figure 7:
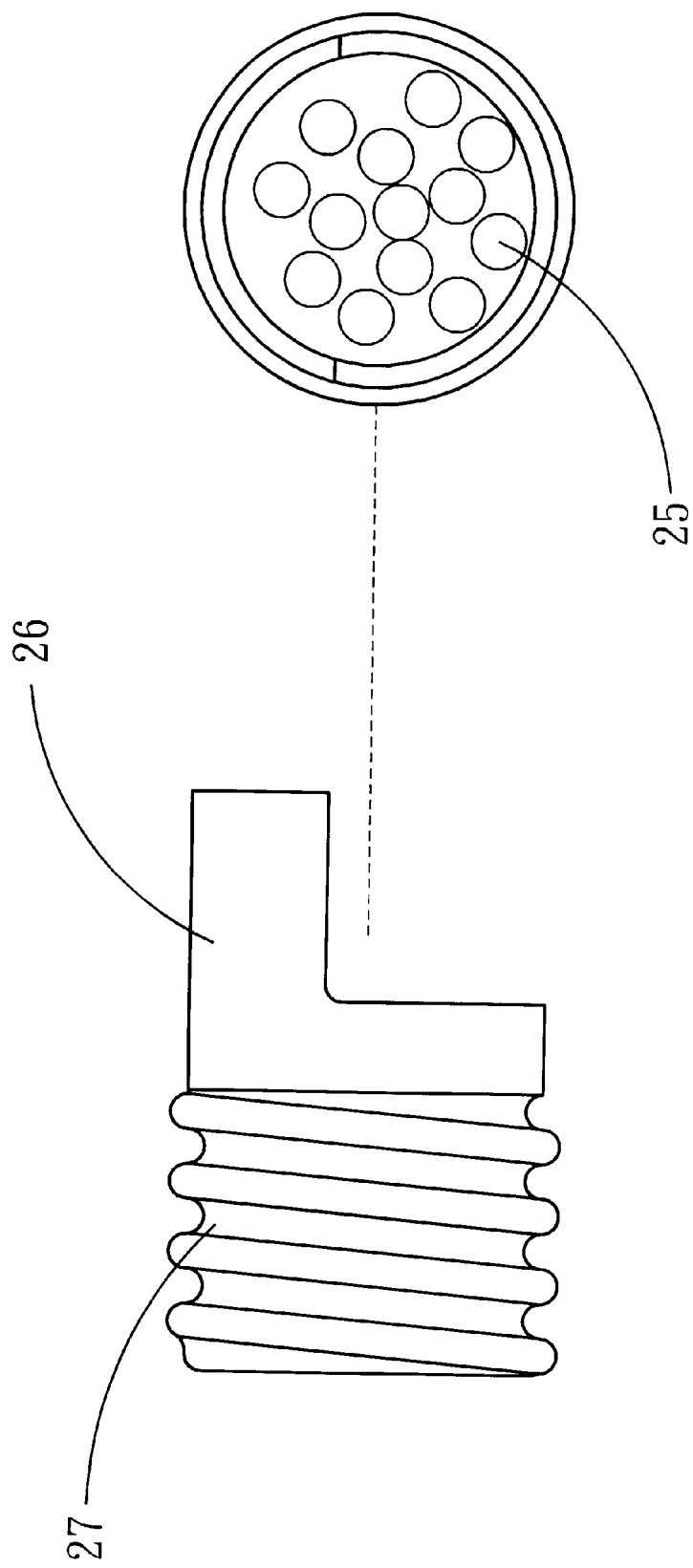
FIG. 7 is a view of method of fabricating LED Assembly in another embodiment of the present invention.

FIG. 7 shows a view of method of fabricating LED assembly in another embodiment of the present invention. As shown in FIG. 7 this LED assembly is applicable as a traffic signal lamp for cross roads. It is characterized in that the LED assembly 25 containing red, green and yellow colors is screwed onto a screw socket 27 without using any luminary but only adding a light shade 26. With this construction, by the aid of direct emission property of LED light, the light signal of one of the cross road at the instant of variation from yellow to red is not visible from the driver waiting at the other cross road so as to evade his/her too early starting thereby eliminating a possible traffic accident as that is apt to happen in case a conventional traffic signal lamp in a non-shaded luminary is installed on a cross road intersection.

Figure 8:
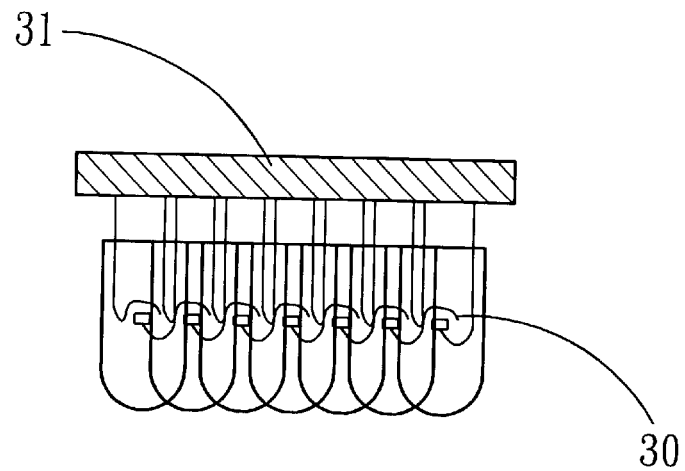
FIG. 8 is a view illustrating the first step of method of fabricating LED assembly in another embodiment of the present invention.

In the first step of fabrication in another embodiment shown in FIG. 8, a plurality of unit LEDS 30 is welded onto an electrical circuit board 31 which has been already cut into a desired shape.

Figure 9:
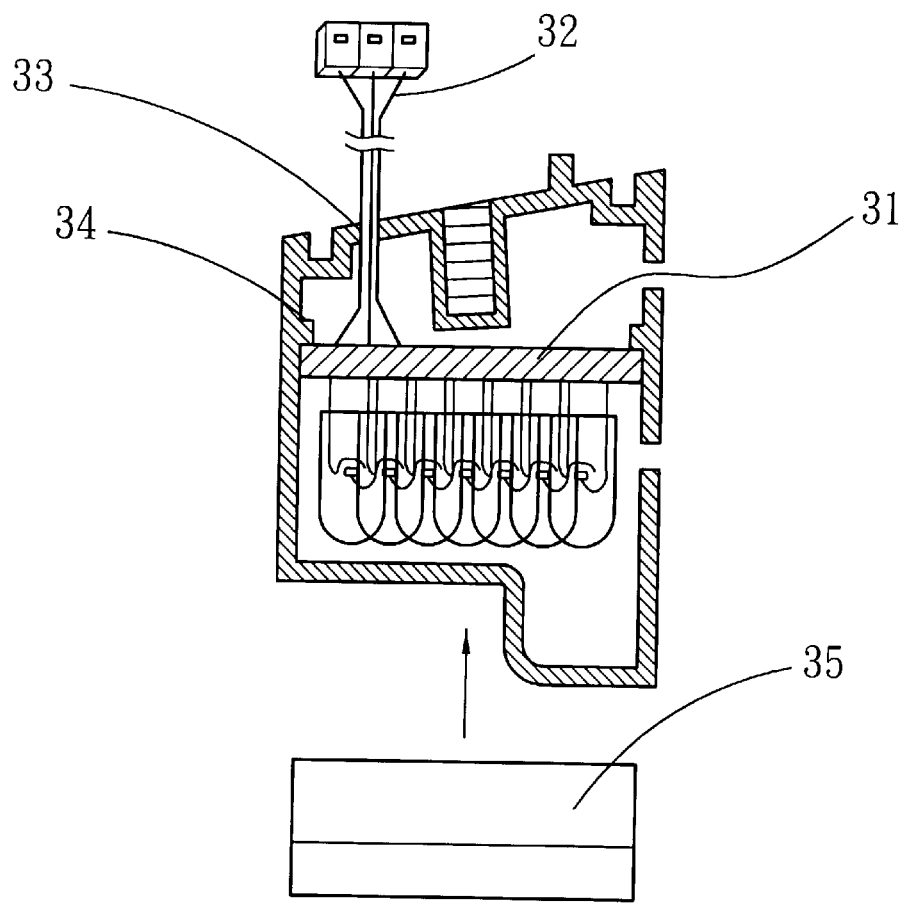
FIG. 9 is a view illustrating the second step of method of fabricating LED assembly in another embodiment of the present invention.

FIG. 9 shows the second step of method of fabricating LED assembly in another embodiment of the present invention, it differs from the step shown in FIG. 1 That lead conductors 32 are not connected to a circuit board 31 in advance, but are passed through the guide hole 33 in a preformed housing before connecting to the circuit board 31. Afterward the circuit board 31 is pushed and engaged to an inner flange 34 of the housing to be fixed thereof, and then the LED assembly is buried in a framed gutter 35.

Figure 10:
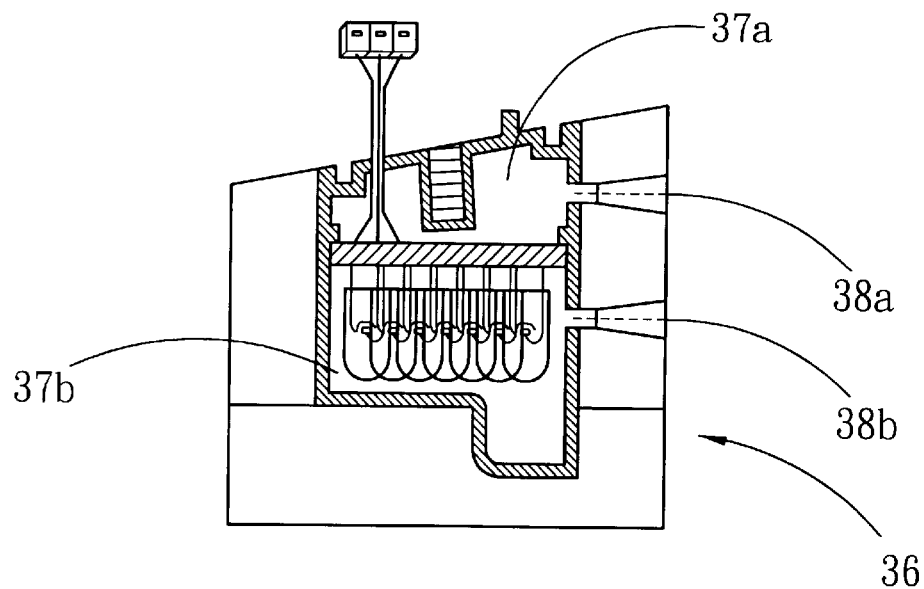
FIG. 10 is a view illustrating the third step of method of fabricating LED assembly in another embodiment of the present invention.

FIG. 10 shows the third step of method of fabricating LED assembly in another embodiment of the present invention, the framed gutter 35 together with the LED assembly is settled in a mold 36, in this case as the inner part of the framed gutter 35 is divided in two spacing by the circuit board 31, a front room 37a and a rear room 37b, so that the resin has to be injected thereinto through respective inlet ports 38a and 38b.

Figure 11:
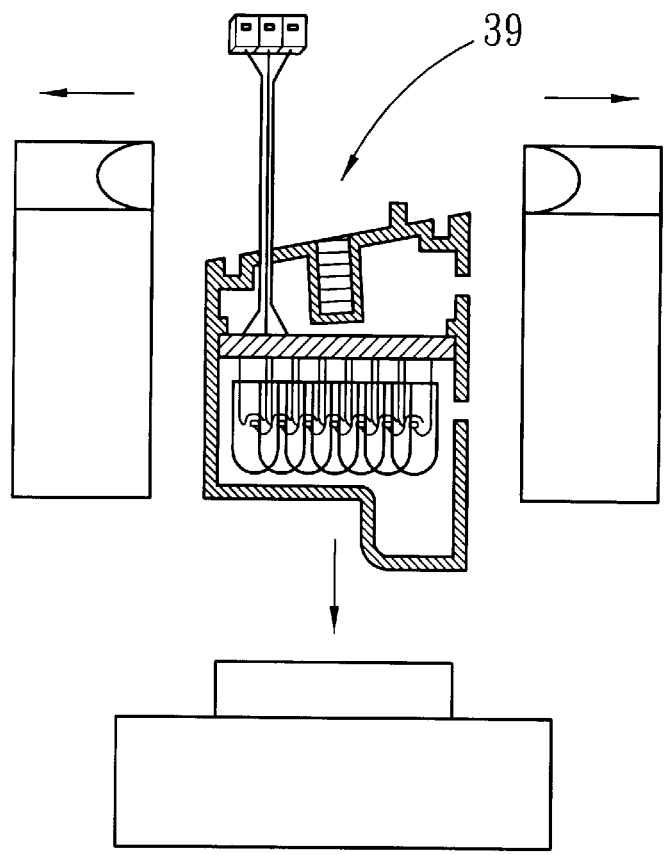
FIG. 11 is a view illustrating the fourth step of method of fabricating LED assembly in another embodiment of the present invention; and Table 1 is a comparison between properties of polyacrylic resin and epoxy resin.

FIG. 11 shown the forth step of method of fabricating LED assembly in another embodiment of the present invention, wherein a finished LED assembly 39 is taken out of the mold cavity after carrying out injection molding about 30 sec. from 90° C. to 60° C. with 99% rate of yield.

Table 1 is a comparison between properties of polyacrylic resin employed in the present invention and epoxy resin employed in prior techniques.

TABLE 1

| State | Epoxy (liquid plastic) | Polyacrylic resin (solid state) |
| --- | --- | --- |
| Way of finishing | Adding hardener and anti-ultra violet ray substance | Heating up to 200° C. |
| Objects to be packaged | LED chip, IC chip | Integrated LED, entirely water-proof IC |
| Way of filling | Coating, spraying, implanting | Squeezing by injection |
| Injection pressure | Almost nil if by coating or implanting | Applying 15 kgf–30 kgf high pressure to squeeze into mold |
| Way of hardening | 85° C. for 4 hours; 100° C. for 2 hours | 155° C. for 10 sec after placed in mold |
| Available waiting time | 25° C. for 4 hours; 40° C. for 5 hours after mixing | No time limit (in any environmental condition) |
| Heat deformation occurring temperature | 122° C. | 135° C. |
| Combustion | Combustible | Non-combustible UL94 |
| Dielectric constant | 3.12 at 1 KHz | 3.09 at 1000 KHz |
| Volumetric resistance | 1.3 x 100,000 Ohm-cm | 1,000,000,000 Ohm-cm and up |
| Arc withstanding ability | none | 130 sec |
| Hardness | 114 R-Scal | 90 R-Scal |
| Boiled water absorption rate | 0.42% for 1 hour (0% at 23° C.) | 0.02% for 1 hour, (0% at 23° C.) |
| Temperature expansion coefficient | 6.0 x (–100,000) | 6.0 x (–100,000) |

In all, after having made careful consideration over the above detailed description of the present invention, it will be clearly understood that the present invention has several noteworthy features which are prominently superior to any conventional techniques, and are as follows:

1. The product has good appearance, smooth contour surfaces due to adequate resin attachment, well-organized disposal of components excellent water tightness and low production cost with nearly 100% rate of yield.

2. A noteworthy contribution to environmental protection that generation of poisonous gas due to heating resin material at high temperature for a long time that is the problem, inherent to conventional methods is eliminated because harmless polyacrylic resin is used with a very short time duration of heating under relatively low temperature in the present invention.

Those who are skilled in the art will readily perceive how to modify the invention. Therefore the appended claims are to be construed to cover all equivalent structures which fall within the true scope and spirit of the invention.

What is claimed is:

1. Method of fabricating LED assembly comprising five steps:

disposing and welding a plurality of unit LEDS onto an ready cut electrical circuit board, and connecting with lead conductors;

burying said LEDS assembled in the precedent step in a framed gutter fixedly, and exposing appropriately portions for injecting polyacrylic resin;

setting said framed gutter together with said LED assembly into a mold cavity;

simultaneously inserting a copper stick into said mold, and injecting polyacrylic resin into said mold cavity after closing said mold cavity; and picking up the finished injection molded LED assembly out of said mold.

2. The method of claim 1, wherein said LED assembly is able to made into a monocolored light source to be used as a lamp bulb.

3. The method of claim 1, wherein a contour of a housing said LED assembly is able to be formed into various kinds of polyhedrons according to configuration of said mold.

* * * * *